US007675085B2

(12) United States Patent
Sorg

(10) Patent No.: US 7,675,085 B2

(45) Date of Patent: Mar. 9, 2010

(54) RADIATION EMITTING COMPONENT

(75) Inventor: Jörg Erich Sorg, Regensburg (DE)

(73) Assignee: Osram Opto Semiconductors GmbH, Regensburg (DE)

(*) Notice: Subject to any disclaimer, the term of this patent is extended or adjusted under 35 U.S.C. 154(b) by 0 days.

(21) Appl. No.: 11/526,984

(22) Filed: Sep. 26, 2006

(65) Prior Publication Data

US 2007/0080337 A1 Apr. 12, 2007

(30) Foreign Application Priority Data

Sep. 29, 2005 (DE) ....................... 10 2005 046 693
Jul. 13, 2006 (DE) ....................... 10 2006 032 416

(51) Int. Cl.
*H01L 33/00* (2006.01)

(52) U.S. Cl. ........... 257/99; 257/E33.057; 257/E33.058

(58) Field of Classification Search .......... 257/E33.056, 257/E33.057, E33.058, E33.065, 99, 693
See application file for complete search history.

(56) References Cited

U.S. PATENT DOCUMENTS 5,656,823 A * 8/1997 Kruangam .................. 257/59
5,706,177 A * 1/1998 Nather et al. ............... 361/768
6,066,861 A * 5/2000 Hohn et al. ................... 257/99
6,335,548 B1 * 1/2002 Roberts et al. ................ 257/98
6,344,689 B1 2/2002 Suzuki et al.
6,486,543 B1 * 11/2002 Sano et al. .................. 257/684
6,586,845 B1 * 7/2003 Higashi et al. .............. 257/784
6,882,380 B2 * 4/2005 Yu et al. ....................... 349/61
2004/0169466 A1 * 9/2004 Suehiro et al. .............. 313/512
2005/0128315 A1 6/2005 Mori et al.
2005/0151142 A1 * 7/2005 Imai ........................... 257/81
2006/0065957 A1 3/2006 Hanyz

FOREIGN PATENT DOCUMENTS

DE 31 28 187 A1 2/1983
DE 102 45 629 A1 4/2004
EP 0 083 627 B1 10/1985
JP 58-147141 9/1983
JP 08-264841 10/1996
JP 2000-077725 3/2000
JP 2001-244508 9/2001
WO WO 2005/064696 7/2005

OTHER PUBLICATIONS

I. Schnitzer et al., "30% external quantum efficiency from surface textured, thin-film light-emitting diodes", Appl. Phys. Lett. 63, No. 15, pp. 2174-2176, Oct. 18, 1993.
Search Report dated Jan. 19, 2007 issued for corresponding European Application No. 06 01 9933.

* cited by examiner

*Primary Examiner*—Minh-Loan T Tran
*Assistant Examiner*—W. Wendy Kuo
(74) *Attorney, Agent, or Firm*—Cohen Pontani Lieberman & Pavane LLP

(57) ABSTRACT

A radiation-emitting component (1) comprising a radiation source, a housing body (6), a radiation exit side (16), an underside (17) which is opposite the radiation exit side (16), a side surface (18) which connects the radiation exit side (16) and the underside (17), and at least one first contact region (2*a*, 3*a*). The first contact region (2*a*, 3*a*) extends along the side surface (18) and is in the form of a partial region of a carrier (23) that runs outside the housing body (6).

32 Claims, 3 Drawing Sheets

D
7
6
4
5
9
3a
A
B
11
3b
B
8
A
2b 15
12
d
7
1
10
2a
3a
10
13
6

RADIATION EMITTING COMPONENT

RELATED APPLICATION

This patent application claims the priority of German patent application 102005046693.1 filed Sep. 29, 2005 and the priority of German patent application 102006032416.1 filed Jul. 13, 2006, the disclosure content of which is hereby incorporated by reference.

FIELD OF THE INVENTION

The invention relates to a radiation-emitting component.

BACKGROUND OF THE INVENTION

The published patent application DE 31 28 187 A1 discloses an optoelectronic component which has a semiconductor body, a carrier, which comprises insulating material, and two connections which are applied to the carrier in a planar manner, extend from a carrying outer surface of the carrier to at least one further outer surface of the carrier and form a connection contact area there. On a bearing surface of the carrier that is opposite the carrying outer surface, the component is placed onto a printed circuit board and connected using a soldering or adhesive bonding operation.

The published patent application DE 102 45 629 A1 discloses an electronic device in which LEDs are integrated in buttons. The LEDs have, on an underside, contact pins which can be used to contact the LEDs to a printed circuit board that is arranged in the electronic device.

LEDs which are currently commercially available have a luminous efficiency of more than 20 lm/W, said efficiency being dependent on the temperature to a considerable extent. It decreases with increasing temperature. In order to prevent an increase in temperature caused by heat loss which occurs and consequently to prevent a reduction in the luminous efficiency when operating the LEDs, it is necessary to cool the LEDs.

In the case of a component which comprises electrical connections on a bearing surface, the bearing surface resting on a printed circuit board, a considerable portion of the heat generated during operation can be dissipated to the printed circuit board via the electrical connections. The component can thus be cooled using the electrical connections. However, heating of the component cannot be excluded if further heat-generating subassemblies, which dissipate the heat generated to the printed circuit board, are present in the vicinity of the component.

In the case of a component whose electrical connections are connected to a printed circuit board via contact pins, only a small portion of the heat can be dissipated to the printed circuit board, as a result of which the component can heat up more easily.

SUMMARY OF THE INVENTION

It is an object of the invention to provide a radiation-emitting component having improved heat dissipation.

This and other objects are attained in accordance with one aspect of the present invention directed to a radiation-emitting component comprising a radiation source, a housing body, a radiation exit side, an underside which is opposite the radiation exit side, a side surface which connects the radiation exit side and the underside, and at least one first contact region which extends along the side surface and is part of a carrier that runs outside the housing body.

The radiation-emitting component may be mounted on the radiation exit side or on the underside. It is also possible for the radiation-emitting component to be mounted on the side surface. In this arrangement, the component preferably emits radiation to the side and can then be referred to as a side-looker. The inventive component is not restricted to a single type of mounting and can, therefore, be used in a multiplicity of apparatuses.

In order to make it possible to mount the component on the radiation exit side, the radiation-emitting component is designed, on the radiation exit side, in such a manner that it can be easily fitted to a further subassembly.

The component is preferably at least partially planar on the radiation exit side so that the component can be adhesively bonded, for example, to the further subassembly.

Furthermore, the radiation-emitting component may be designed in such a manner that it can be inserted, clamped or latched into a further subassembly on the radiation exit side.

In order to make it possible to mount the component on the underside, the component is preferably bounded, on the underside, by a planar bearing surface comprising electrical connections. An SMD (Surface Mount Device) component is particularly suitable for mounting on the underside. SMD components can be advantageously fitted in series and thus in a cost-effective manner.

The side surface of the component is also essentially planar. This means that the side surface can be slightly curved at least in places. An essentially planar design of the side surface makes it possible to mount the component in a simple manner, for example on a printed circuit board.

According to one preferred embodiment, the side surface is provided for the purpose of connecting the component in a thermal manner. To this end, the first contact region which extends along the side surface is thermally conductive. It is particularly preferred for the first contact region to be connected to a cooling body, for example a cooling plate, in order to cool the radiation-emitting component. Each side surface of the component, and also the outer surface on the radiation exit side or underside, can comprise at least one first contact region to which the heat generated during operation can be dissipated from the radiation source.

In this case, the housing body or the radiation-emitting component is constructed in such a manner that heat can be effectively transported from the radiation source to the first contact region. For example, a thermally conductive path which directly connects the radiation source to the first contact region may run along an outer wall of the housing body.

In one preferred embodiment, the first contact region is in the form of a tab-shaped partial region of the carrier. In a further preferred manner, this tab-shaped partial region tapers at the junction with the remaining carrier. The tab shape of the first contact region makes it possible, after the carrier has been produced, to further process the carrier in a simple manner, for example to bend the first contact region at the junction.

Bending may be effected in such a manner that the first contact region is bent out of a plane that extends along the underside.

A carrier which has been bent in this manner can advantageously engage around the housing body, as a result of which the housing body is mechanically fixed in the carrier and lateral displacement of the carrier is thus prevented.

The radiation-emitting component comprises at least one second contact region which extends along the underside of the radiation-emitting component. This second contact region is preferably electrically conductive.

Functionally subdividing the conductive regions into the first contact region, which is thermally conductive, and into the second contact region, which is electrically conductive, has the advantage that the component, apart from being cooled using the electrical connections which are implemented using the second contact regions, can be cooled using a separate thermal connection which is implemented using the first contact region.

Furthermore, the first contact region may be additionally electrically conductive. This advantageously makes it possible to combine the first and second contact regions in one element. The second contact region can thus be in the form of a further partial region of the carrier.

The radiation-emitting component may also comprise a plurality of second contact regions.

The carrier is preferably in two parts, with the result that a first partial carrier forms a first electrical connection and a second partial carrier forms a second electrical connection. It is particularly preferred for the two partial carriers to each comprise at least one first contact region and at least one second contact region.

In one preferred embodiment, the carrier is electrically and thermally conductive. Thermal and electrical conductivity of the carrier makes it possible for the carrier to contain a metal and/or a metal compound. The carrier preferably contains a copper alloy, for example a copper/nickel alloy.

The carrier may be produced as a stamped part in a particularly simple manner.

In one preferred embodiment, the radiation source comprises at least one radiation-emitting semiconductor chip. It is particularly preferred for the radiation-emitting semiconductor chip to be a thin-film semiconductor chip.

A thin-film semiconductor chip is distinguished, in particular, by at least one of the following characteristic features:

a reflective layer is applied or formed in a first main area of a radiation-generating epitaxial layer sequence that faces toward a carrier element, said reflective layer reflecting at least part of the electromagnetic radiation generated in the epitaxial layer sequence back into the latter;

the epitaxial layer sequence comprises a thickness in the region of 20 μm or less, in particular in the region of 10 μm; and the epitaxial layer sequence contains at least one semiconductor layer with at least one area comprising an intermixing structure which ideally leads to an approximately ergodic distribution of the light in the epitaxial layer sequence, that is to say it comprises a stochastic scattering behavior which is as ergodic as possible.

A basic principle of a thin-film semiconductor chip is described, for example, in I. Schnitzer et al., Appl. Phys. Lett. 63 (16), Oct. 18, 1993, 2174-2176, the disclosure content of which is in this respect hereby incorporated by reference.

A radiation-emitting thin-film semiconductor chip is, to a good approximation, a Lambert surface radiator and is therefore particularly well suited to use in an electronic device, for example as a flashlight in a mobile telephone, for instance having an integrated camera.

Depending on the wavelength, the semiconductor chip may be produced on the basis of different semiconductor material systems. For example, a semiconductor body based on $In_xGa_yAl_{1-x-y}As$ is suitable for long-wave radiation, a semiconductor body based on $In_xGa_yAl_{1-x-y}P$ is suitable for visible red to yellow radiation, and a semiconductor body based on $In_xGa_yAl_{1-x-y}N$ is suitable for short-wave visible (green to blue) or UV radiation, $0 \leqq x \leqq 1$ and $0 \leqq y \leqq 1$.

The radiation source is preferably arranged on the carrier. For this purpose, the carrier comprises a mounting region or a chip mounting region. The chip mounting region is expediently provided on a side of the carrier that is opposite the underside. The carrier may also comprise a chip connection region on this side, the semiconductor chip being connected to said chip connection region using a bonding wire, for example.

The heat generated during operation of the radiation-emitting component can be transported away by virtue of the fact that the chip mounting region is connected to one of the first contact regions in a thermally conductive manner.

The chip mounting region is preferably a partial region of the second contact region of the first partial carrier and is directly connected to one or more of the first contact regions of the first partial carrier.

In addition, the chip connection region may be a partial region of the second contact region of the second partial carrier.

In one preferred embodiment, the radiation source is operated as a flashlight. In this case, it comprises a radiation-emitting thin-film semiconductor body which preferably emits pulses having a duration of between 300 and 400 ms, the pulses following one another in a 3 second cycle. In this case, a conventional component which has not been cooled to a sufficient extent would heat up to a considerable degree. In the context of the invention, this can be prevented by thermally connecting the component to a cooling body. This has the advantage that the intensity of the radiation generated by the thin-film semiconductor body remains approximately constant.

In addition to the radiation-emitting semiconductor chip, an ESD (electrostatic discharge) semiconductor chip may be arranged in the chip mounting region, in particular in the case of pulsed operation. The two semiconductor chips are typically connected up back-to-back.

If the radiation-emitting semiconductor chip is a thin-film semiconductor chip, it may be mounted as a flip-chip on the p-type side, while the ESD semiconductor chip is mounted on the n-type side in a conventional manner.

The radiation emitted by the radiation source or by the semiconductor chip is not restricted to a single wavelength. Rather, the wavelength of the radiation generated by the radiation source can be at least partially converted using a conversion element which is arranged downstream of the radiation source in the radiating direction. The conversion element typically absorbs at least part of the radiation emitted by the semiconductor chip and then preferably emits radiation at a longer wavelength than the wavelength of the radiation which was originally emitted by the semiconductor body. Resultant radiation is produced by mixing that part of the radiation whose wavelength has been converted with the radiation that was originally emitted by the semiconductor chip. Polychromatic light, preferably white light, can thus be generated.

Polychromatic light may also be generated by using at least two semiconductor chips for the radiation source, said semiconductor chips emitting light at different wavelengths and their light optionally being mixed.

An electrically insulating layer is preferably arranged between the carrier, which engages around the housing body, for example, and the housing body. Said layer comprises openings for elements, for example the radiation source, which are arranged on the carrier. This layer may advantageously connect the two partial carriers to one another if the carrier is in two parts. It is particularly preferred for the electrically insulating layer to contain a plastic material. This plastic material may be, for example, glass-fiber-reinforced.

The radiation source may be surrounded by the housing body. As a result, the radiation source may be protected against damage that is caused, for example, by mechanical or thermal effects from the outside.

The housing body may also comprise a beam-directing or beam-shaping element in the radiating direction. The radiating characteristics of the radiation source may be advantageously influenced thereby. For example, these elements may be a reflector or a lens.

In one preferred embodiment, the beam-directing or beam-shaping element is integrally formed with the housing body. For example, the beam-directing or beam-shaping element and the housing body may be produced using injection molding.

In the case of an SMD component, it must be ensured that the materials used for the beam-shaping element and for the housing body are suitable for soldering, that is to say that the materials used do not change during soldering during which temperatures of approximately 260° C. may occur. Suitable materials are, for example, an epoxy resin, a silicone-based material, a mixture of epoxy and silicone resins, a high-temperature thermoplastic or a thermosetting plastic.

The inventive radiation-emitting component may be used for an electronic device. It has the advantage that it comprises a small physical depth, for example 2 mm, as a result of which it is particularly suitable for an electronic device such as a PDA (Personal Digital Assistant), a digital camera or a mobile telephone, which are likewise intended to comprise a small physical depth. It also has the advantage that the thermal connection can be implemented independently of the electrical connection.

In one preferred exemplary embodiment of an electronic device, the radiation-emitting component is operated as a flashlight in a camera of a mobile telephone, preferably using alternating current. In contrast to a conventional discharge lamp, such a flashlight does not require a charging time. The radiation-emitting component can also be operated using direct current. In this case, the component is particularly suitable as a film light for video cameras, for example.

The inventive component can also be effectively cooled since a cooling body or a heat sink can be connected to the first contact regions. This cooling body preferably contains a metal. However, a ceramic material is also conceivable.

Alternatively, the cooling body may be connected to the second contact regions, while the electrical connection is effected via the first contact regions. It goes without saying that the cooling body is arranged in such a manner that a short circuit does not occur during operation.

Advantageously homogeneous illumination can also be achieved using a suitable optical arrangement, for example a combination of the beam-directing or beam-shaping element, which is arranged in the radiation-emitting component, and a window in the electronic device, said window being in the form of a funnel, for example, and the radiation-emitting component being arranged in said window or being upstream of said window in the radiating direction. For example, the flashlight semiconductor chip may illuminate a field of approximately 0.87 m×1.15 m at a distance of approximately 1 m.

DETAILED DESCRIPTION OF THE DRAWINGS

Figure 1:
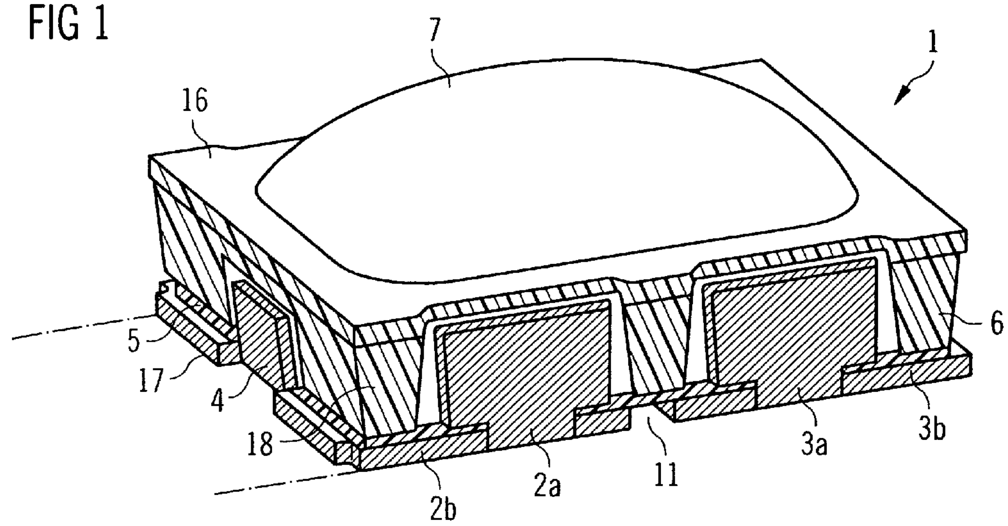
FIG. 1 shows a diagrammatic perspective view of an exemplary embodiment of an inventive radiation-emitting component.

FIG. 1 diagrammatically shows an inventive radiation-emitting component 1. The latter comprises a lens 7 which is carried by a housing body 6. The housing body 6 is arranged on a two-part carrier 23 (see FIG. 2) having a partial carrier 2 and a partial carrier 3 (see FIG. 2) which are separated from one another by the slot 11.

The two partial carriers 2, 3 are each produced from a stamped part.

The partial carrier 2 comprises a first contact region 2*a* and a second contact region 2*b*. In a corresponding manner, the partial carrier 3 comprises a first contact region 3*a* and a second contact region 3*b*. The first contact regions 2*a* and 3*a* are thermally conductive and extend along a side surface 18. In addition, two further first contact regions extend along that side surface which is opposite this side surface. The second contact regions 2*b* and 3*b* are electrically conductive.

Further contact regions 4 which extend along the side surfaces may be optionally connected to a cooling body or an electrical power supply.

The housing body 6 comprises indentations in the form of recesses in which the first contact regions 2*a*, 3*a* and the contact regions 4 engage. The contact regions thus do not project with respect to the housing body 6.

The two partial carriers 2, 3 are connected to one another by means of an electrically insulating layer 5 and form the carrier 23 (see FIG. 2) which engages around the housing body 6. The housing body 6 is thus mechanically fixed.

A radiation-emitting semiconductor chip 8 (see FIG. 3) is preferably arranged in the second contact region 2*b*. The latter is advantageously connected to the first contact region 2*a* in a thermally conductive manner so that the heat produced during operation can be dissipated from the semiconductor chip 8 via the first contact region 2*a*.

Figure 2:
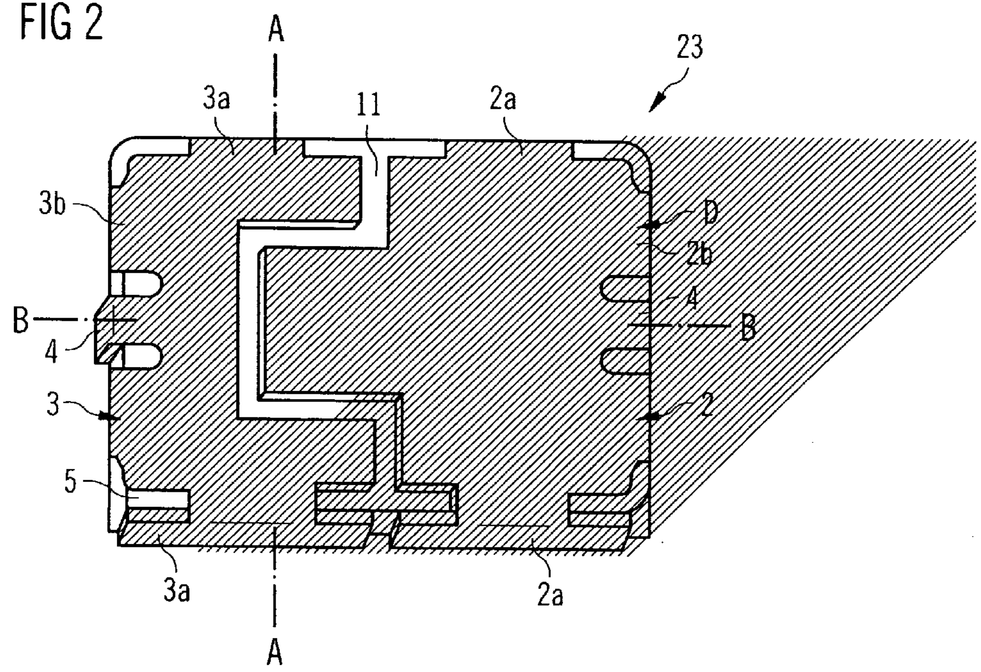
FIG. 2 shows a diagrammatic view of the underside of the inventive component according to the exemplary embodiment.

FIG. 2 illustrates the underside 17 of the radiation-emitting component 1 illustrated in FIG. 1. The carrier 23 which comprises the two partial carriers 2 and 3, which are separated by the slot 11, is arranged on the underside 17. The contact regions 4, 2*a* and 2*b* are integrally formed. The contact regions 4, 3*a* and 3*b* are also integrally formed.

The carrier 23 is shaped like a shell in which the electrically insulating layer 5 can be inserted. The housing body may also be introduced into this type of shell with an accurate fit. The two partial carriers 2, 3 can be held together by means of the electrically insulating layer 5. The lines A-A and B-B bound a part D of the radiation-emitting component 1 that is illustrated in FIG. 3.

Figure 3:
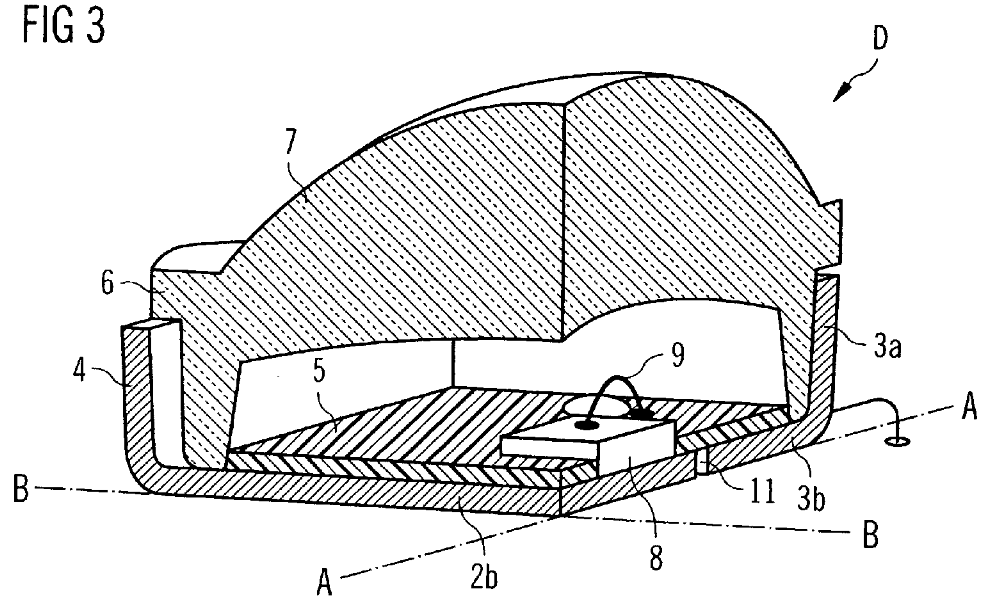
FIG. 3 shows a diagrammatic sectional view of the inventive component according to the exemplary embodiment.

In the sectional view of the radiation-emitting component 1 that is shown in FIG. 3, the lens 7 and the housing body 6 are shown to be integrally formed. The housing body 6 is essentially formed in the manner of a base. The lens 7 is arranged, like a domed attachment, on the housing body 6. The distance between the radiation-emitting semiconductor chip 8 and the lens 7 can be advantageously set in a suitable manner by means of the height of the housing body 6.

The second contact region 2*b* comprises a chip mounting region in which the semiconductor chip 8 is mounted. Starting from the semiconductor chip 8, a bonding wire 9 runs to the second contact region 3*b*. The electrically insulating layer 5 comprises Openings for the semiconductor chip 8 and the bonding wire 9.

Figure 4:
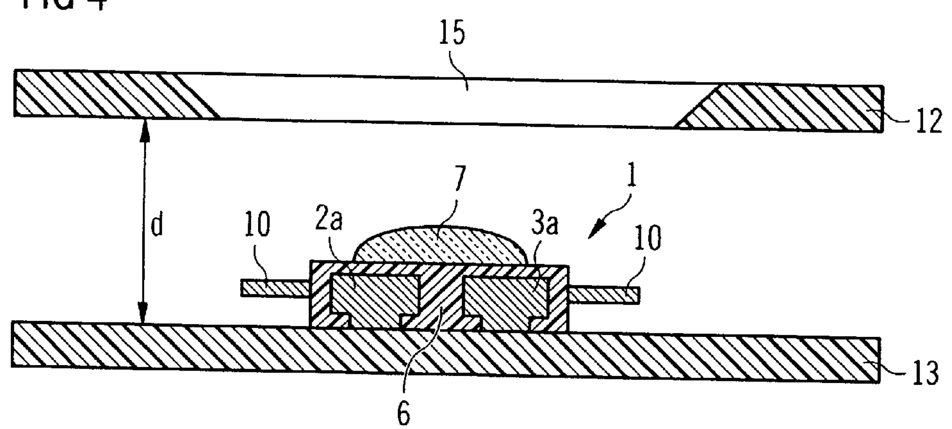
FIG. 4 shows a sectional view of a first exemplary embodiment of an electronic device.

FIG. 4 illustrates a cross-sectional view of part of an electronic device, for example a mobile telephone. An upper shell 12 and a lower shell 13 of the device housing can be seen. Integrated in the lower shell 13 is a printed circuit board on the underside of which the radiation-emitting component 1 is arranged. Said component is preferably soldered to the printed circuit board.

The radiation-emitting component 1 is electrically connected via the second contact regions which are arranged on the underside. The heat generated during operation can also be dissipated to the printed circuit board via these second contact regions.

Cooling bodies 10 are fitted to the contact regions 4 for the purpose of additional cooling. Cooling bodies may also be fitted to the contact regions 2*a* and 3*a*. Such cooling is advantageous, in particular, when the radiation source is operated as a flashlight. As simulation has shown, a component may heat up to more than 200° C. over the course of 20 pulses if there is no additional cooling. In this case, the flashlight emits pulses having a duration of between 300 and 400 ms, the pulses following one another in a 3 second cycle.

A suitable optical arrangement can be used to ensure that a field to be illuminated is homogeneously illuminated. In this case, the distance d between the upper shell 12 and the lower shell 13 needs to be taken into account. The optical arrangement is particularly preferably composed of a lens 7, which is part of the radiation-emitting component 1, and a window 15 in the upper shell 12, which window is in the form of a funnel and is, if appropriate, mirror-coated.

Figure 5:
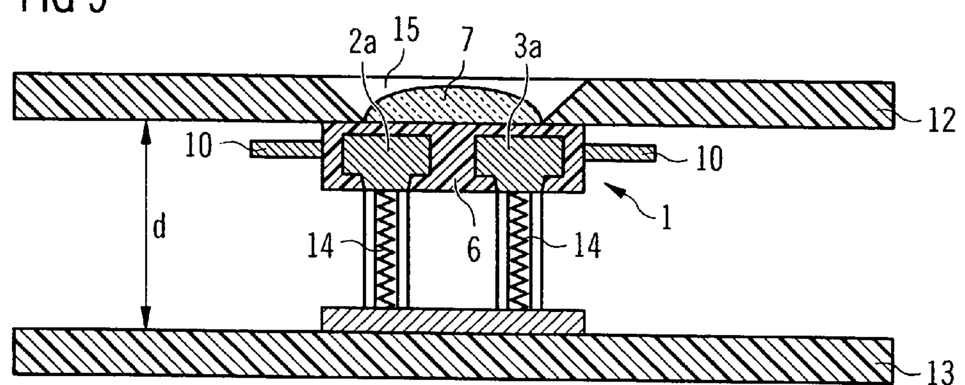
FIG. 5 shows a sectional view of a second exemplary embodiment of an electronic device.

FIG. 5 shows an alternative embodiment of the electronic device illustrated in FIG. 4. In this case, the radiation-emitting component 1 is mounted on a radiation exit side 16 (see FIG. 1) and is held by the upper shell 12.

The distance d between the upper shell 12 and the lower shell 13 is advantageously irrelevant for a suitable optical arrangement since the lens 7 projects into the window 15 and the radiation emitted by the radiation source is directly injected into the window 15.

Whereas the radiation can be focused using the lens 7, absorption losses can be reduced using the window 15 which is in the form of a reflector, with the result that the optical arrangement can be used overall to increase the intensity of the radiation emitted in a radiation cone.

The radiation-emitting component 1 is still electrically connected using the printed circuit board that is integrated in the lower shell 13. However, the second contact regions are not in direct contact with the printed circuit board. Rather, flexible contacts 14, preferably contact springs, are used as the connection between the second contact regions and the printed circuit board. Such an electrical connection has the advantage that the flexible contacts 14 can be used to bridge any desired distance d.

However, the component 1 can be sufficiently cooled only with difficulty as a result of the flexible contacts 14 which typically comprise a small diameter. However, since the contact regions 2*a*, 3*a* and 4, which are connected to the cooling bodies 10 (not shown for the contact regions 2*a*, 3*a*), extend along the side surfaces in the inventive component 1, efficient cooling can be effected thereby.

Figure 6:
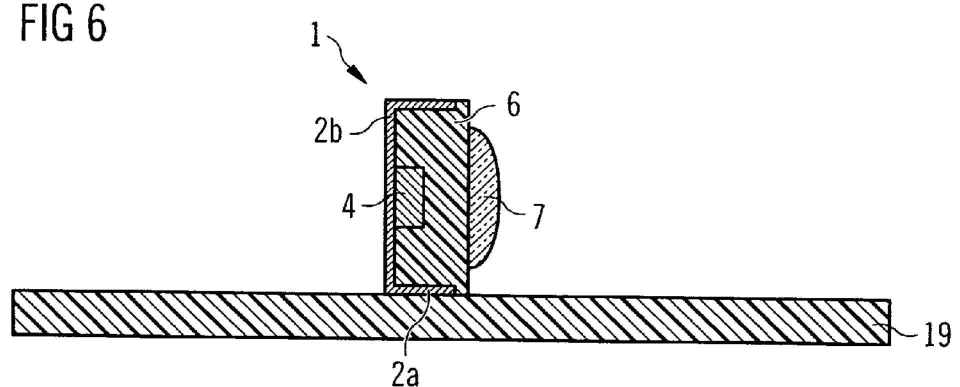
FIG. 6 shows a side view of an inventive component mounted on the side surface.

The radiation-emitting component 1 illustrated in FIG. 6 may be referred to as a sidelooker. Radiation is effected in the lateral direction, parallel to the main direction of extent of a printed circuit board 19.

The side surface 18 (see FIG. 1) may be used as a mounting area, the component being able to be electrically connected using the first contact region 2*a* and the first contact region 3*a* (not illustrated) which extend along the side surface 18 (see FIG. 1).

In this embodiment, the component can be cooled using the contact regions 4 and/or the second contact region 2*b* and the second contact region 3*b* (not illustrated).

The invention is not restricted by the description on the basis of the exemplary embodiments. Rather, the invention comprises any new feature and any combination of features, which includes, in particular, any combination of features in the patent claims, even if this feature or this combination itself is not explicitly specified in the patent claims or exemplary embodiments.

I claim:

1. A radiation-emitting component comprising:

a radiation source;

a housing body;

a radiation exit side;

an underside which is opposite the radiation exit side;

a side surface which connects the radiation exit side and the underside, the side surface comprising a housing body side surface of the housing body;

a carrier comprising at least two parts, at least one of the two parts comprising at least one first contact region extending along the housing body side surface outside the housing body; and an electrically insulating layer arranged between the carrier and the housing body and connecting the two parts of the carrier, the electrically insulating layer being separate from the housing body.

2. The radiation-emitting component as claimed in claim 1, wherein the component is mounted on the radiation exit side.

3. The radiation-emitting component as claimed in claim 1, wherein the component is mounted on the underside.

4. The radiation-emitting component as claimed in claim 1, wherein the component is mounted on the side surface.

5. The radiation-emitting component as claimed in claim 1, wherein the first contact region is thermally conductive.

6. The radiation-emitting component as claimed in claim 1, wherein the first contact region is in the form of a tab-shaped partial region of the carrier.

7. The radiation-emitting component as claimed in claim 1, wherein the first contact region is bent out from a plane that extends along the underside.

8. The radiation-emitting component as claimed in claim 1, further comprising at least one second contact region which extends along the underside.

9. The radiation-emitting component as claimed in claim 8, wherein the second contact region is electrically conductive.

10. The radiation-emitting component as claimed in claim 8, wherein the second contact region is in the form of a partial region of the carrier.

11. The radiation-emitting component as claimed in claim 1, wherein the carrier is thermally and electrically conductive.

12. The radiation-emitting component as claimed in claim 1, wherein the carrier comprises a metal and/or a metal compound.

13. The radiation-emitting component as claimed in claim 12, wherein the metal compound is a copper alloy.

14. The radiation-emitting component as claimed in claim 1, wherein the radiation source comprises at least one radiation-emitting semiconductor chip.

15. The radiation-emitting component as claimed in claim 14, wherein the radiation-emitting semiconductor chip is a thin-film semiconductor chip.

16. The radiation-emitting component as claimed in claim 14, wherein the carrier comprises a chip mounting region for the semiconductor chip.

17. The radiation-emitting component as claimed in claim 16, wherein the chip mounting region is connected to the first contact region in a thermally conductive manner.

18. The radiation-emitting component as claimed in claim 16, wherein the chip mounting region is a partial region of the second contact region.

19. The radiation-emitting component as claimed in claim 14, wherein the carrier comprises a chip connection region for the semiconductor chip.

20. The radiation-emitting component as claimed in claim 19, wherein the chip connection region is a partial region of the second contact region.

21. The radiation-emitting component as claimed in claim 1, wherein the radiation source is operated as a flashlight.

22. The radiation-emitting component as claimed in claim 1, wherein a conversion element is arranged downstream of the radiation source in the radiating direction, said conversion element at least partially converting radiation at a first wavelength, which is emitted by the radiation source, into radiation at a second wavelength that is different from the first wavelength.

23. The radiation-emitting component as claimed in claim 1, wherein the electrically insulating layer contains a plastic material.

24. The radiation-emitting component as claimed in claim 1, wherein a beam-shaping element is arranged downstream of the radiation source.

25. The radiation-emitting component as claimed in claim 24, wherein the beam-shaping element is integrally formed with the housing body.

26. An electronic device having a radiation-emitting component as claimed in claim 1, wherein the first contact region is connected to a cooling body.

27. The electronic device as claimed in claim 26, wherein the second contact region is electrically connected.

28. The electronic device as claimed in claim 26, wherein the electronic device is a PDA, a digital camera or a mobile telephone.

29. The electronic device as claimed in claim 28, wherein the radiation-emitting component is provided for flashlight operation.

30. The electronic device as claimed in claim 28, wherein the radiation-emitting component is provided for continuous operation.

31. The radiation-emitting component as claimed in claim 1, wherein the housing body forms a cavity for the radiation source.

32. The radiation-emitting component as claimed in claim 1 further comprising contact springs for electrically contacting the carrier.

* * * * *